United States Patent

Mrozek

[15] 3,641,461

[45] Feb. 8, 1972

[54] TEMPERATURE COMPENSATED CRYSTAL OSCILLATOR

[72] Inventor: Pawel K. Mrozek, Washington, Pa.

[73] Assignee: RCA Corporation

[22] Filed: Aug. 23, 1968

[21] Appl. No.: 755,521

Related U.S. Application Data

[63] Continuation-in-part of Ser. No. 591,860, Nov. 3, 1966, abandoned.

[52] U.S. Cl. ..........331/116 R, 331/176

[51] Int. Cl. ..........H03b 5/36

[58] Field of Search ..........331/116, 176, 66, 158, 159–164; 310/8.9, 8.2; 332/26

[56] References Cited

UNITED STATES PATENTS

| | | | |
|---|---|---|---|
| 3,176,244 | 3/1965 | Newell et al. | 331/176 |
| 3,256,496 | 6/1966 | Angel | 331/116 |
| 3,322,981 | 5/1967 | Brenig | 331/116 |

FOREIGN PATENTS OR APPLICATIONS

| | | | |
|---|---|---|---|
| 1,060,922 | 7/1959 | Germany | 331/176 |
| 895,041 | 4/1962 | Great Britain | 331/164 |

*Primary Examiner*—John Kominski
*Attorney*—Edward J. Norton

[57] ABSTRACT

A crystal controlled oscillator is frequency sensitive to variations in crystal load capacitance in circuit with the crystal, to variations in temperature and to operation over extended periods of time. A variable capacitor is provided in circuit with the crystal so as to correct for the crystal frequency drifts due to changes in operation of the crystal over extended periods of time. A separate fixed capacitor is connected in series with the crystal and in circuit with the variable capacitor to provide part of the frequency determining circuit of the crystal oscillator. A temperature compensation network is coupled across the fixed capacitor and is responsive to temperature changes to provide a correct degree of load capacitance change in the circuit so that the oscillator frequency is maintained within a given frequency tolerance regardless of the adjustment of the variable capacitor which is used to adjust the crystal for frequency drift.

2 Claims, 3 Drawing Figures

INVENTOR
PAWEL K. MROZEK
By Edward J. Norton
ATTORNEY

TEMPERATURE COMPENSATED CRYSTAL OSCILLATOR

This is a continuation of my copending application Ser. No. 591,860 filed Nov. 3, 1966 and now abandoned.

This invention relates to oscillators and more particularly to an improved temperature compensated crystal oscillator.

Temperature compensated oscillators have been known for a number of years. This method of achieving an accurate and stable frequency source over wide temperature ranges has a number of important advantages compared to the better-known oven controlled oscillators. The temperature compensated oscillator has among other advantages (*a* ) the elimination of warmup time, (*b*) the reduction of power drain, and (*c*) improvement in long term crystal stability because of the lower average operating temperature of the crystal. This type of circuit is particularly suitable for use in portable and mobile applications where the power drain of an oven is intolerable, and a fast warmup time is desired. Also the temperature compensated crystal oscillator is particularly suitable for use in applications where long term crystal frequency stabilization is necessary.

The compensation for crystal frequency drifts due to temperature is usually accomplished in temperature compensated crystal oscillators by varying the crystal load capacitance ($C_5$) in a predetermined manner to compensate for crystal frequency changes with temperature. Accurate control of circuit components and crystal parameters is required to insure that the crystal compensating network temperature characteristic matches that of the crystal to the specified tolerance limits. The required load capacitance change $\Delta C_s$ as a function of temperature can be provided by a number of temperature sensitive networks such as a thermistor capacitor or a thermistor voltage variable capacitor. However, because changes occur in the oscillator frequency over an extended period of time necessitating frequency adjustment, the compensation after the frequency is adjusted may change which adds to the overall frequency tolerance of the oscillator. Because of this effect, critical requirements are normally placed on the crystal itself in terms of better aging and tighter tolerances.

It is an object of the applicant's invention to provide an improved temperature compensated crystal oscillator.

It is another object to provide an improved temperature compensated crystal oscillator in which changes in the compensation after the oscillator frequency is adjusted are minimized by minimizing the variations of crystal frequency sensitivity to load capacitance.

It is a further object of the present invention to provide an improved temperature compensated crystal oscillator in which variations of crystal frequency sensitivity to load capacitance are minimized by making use of the resistive changes as well as the capacitive changes of a thermistor capacitor network, or equivalent, with temperature.

Briefly, there is provided in accordance with one embodiment of the invention a temperature compensated crystal oscillator having a frequency determining circuit comprising a fixed capacitance connected in series with the crystal and a variable capacitor. The oscillator is frequency sensitive to changes in the crystal load capacitance due to changes in temperature. A temperature compensating network operates to alter the crystal load capacitance in a manner to compensate for frequency drift with temperature within a given tolerance. The variable capacitor can be operated to correct for long term crystal frequency drift and, when so operated, can alter the degree of compensating load capacitance change affected by the temperature compensating network, whereby the range of tolerable frequencies is outside the given tolerance.

In accordance with the present invention, the temperature compensation network is connected across only the fixed capacitance of the frequency determining circuit of the crystal oscillator. Any altering of the degree of compensating load capacitance change by the temperature compensating network due to a frequency adjustment by the variable capacitor is minimized, thereby maintaining said given frequency tolerance.

Figure 1:
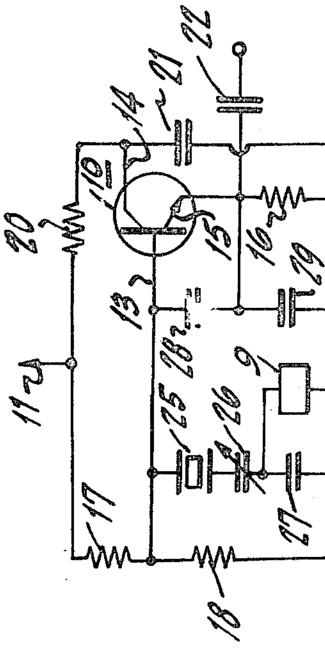
FIG. 1 is a circuit diagram of one embodiment of the present invention.

Referring to FIG. 1 of the drawing, an oscillator similar to the Colpitts type embodying the present invention is shown. A transistor 10 is shown illustratively as an NPN junction transistor and is biased by a stabilized voltage applied at terminal 11. The positive terminal of a unidirectional potential source (not shown) is connected to terminal 11 with its return terminal connected to conductor 12 at ground or other reference potential. The emitter 15 of transistor 10 is forward biased with respect to the base 13 by means of a resistor 16 connected between the emitter 15 and ground. A pair of resistors 17 and 18 are connected in series between the positive terminal 11 and ground. A connection from the junction of the resistors 17, 18 to the base 13 provides conventional transistor base bias. A resistor 20 and an RF bypass capacitor 21 are connected in series between the positive terminal 11 and ground with the junction of the capacitor 21 and resistor 20 connected to the collector 14. An output coupling capacitor 22 is connected to the emitter 15. The frequency determining circuit comprises a crystal 25 connected in series with a fixed capacitance 27 and a variable capacitance 26 between the base 13 and ground. The frequency determining circuit also includes a pair of fixed capacitors 28 and 29 series connected between the base 13 and ground. A connection is completed from the emitter 15 to the junction of the capacitors 28 and 29. Capacitors 28, 29 provide the correct amount of feedback to sustain oscillations. The total oscillator voltage appears across this frequency determining circuit which is in effect connected between the base 13 and collector 14 of the transistor.

Solution of the voltage equivalent circuit of FIG. 1 in terms of parallel emitter and base parameters is shown below:

$$\frac{\Delta f}{f_o}=\left(\frac{C_1\cdot 10^6}{2(C_o+C_s)}\right)\left(1+\frac{C_sR_s}{C_ER_E}+\frac{C_sR_s}{C_BR_B}\right)\text{ in ppm}$$

(parts per million) (1)

where $f_o$ = crystal series resonant frequency $\Delta f=f-f_o$, $f$= frequency of oscillations $C_l$ = crystal motional capacitance $C_o$ = crystal shunt capacitance $C_E$ = equivalent total parallel emitter to collector capacitance $C$ = capacitance series combination of capacitors 26 and 27

$R_E$ = equivalent total parallel emitter-to-collector resistance including output resistance $C_B$ = equivalent total parallel base to emitter capacitance $R_B$ = equivalent total base to emitter input resistance $C_s$ = effective total load capacitance given by $$\frac{1}{C_s}=\frac{1}{C_E}+\frac{1}{C_B}+\frac{1}{C}$$

$R_s$ = total circuit series resistance

Frequency compensation is conventionally achieved by varying the crystal load capacitance ($C_s$) to compensate for the crystal frequency changes with temperature. The required load capacitance change ($\Delta C_s$) as a function of temperature, can be provided by a number of temperature sensitive networks such as a thermistor-capacitor or thermistor voltage variable capacitor. FIG. 1 shows a compensation network 9 which may be for example a thermistor capacitor temperature compensation network. For a given change in temperature, network 9 provides a given amount of compensating capacitance change $\Delta C$ and thermistor resistance change $R_t$. Compensation networks can be connected in parallel with any of the circuit capacitors or in parallel with the crystal. However, since $C_B$ (capacitor 28) and $C_E$ (capacitor 29) are large requiring large load capacitance changes ($\Delta C_E$ and/or $\Delta C_B$)

for a given frequency change ($\Delta F$), the more conventional practice is to place the small compensating capacitance $\Delta C$ which is part of and is controlled by the temperature sensitive network 9 in parallel with a variable (trimmer) capacitor which is connected in series with the crystal. This series variable (trimmer) capacitor is equivalent to the capacitance C provided by the series combination of capacitors 26 and 27 in FIG. 1. From the equation (1) above, it is seen that the frequency of oscillation depends also on circuit resistance ($R_s$). However, the effect of resistance can be made negligible by making $R_E C_E$ and $R_B C_B$ sufficiently large. The value of the compensating capacitance ($\Delta C$) is small compared to the load capacitance $C_s$ and therefore the relationship between compensating capacitance $\Delta C$ and frequency change $\Delta F$ can be obtained by differentiating equation (1) first with respect to $C_s$ and then with respect to the single variable capacitor yielding:

$$\Delta F = \frac{-C_1 \Delta C 10^6}{2C^2\left(1+\frac{C_o}{C_s}\right)^2} \text{ in ppm} \qquad (2)$$

With $\frac{C_o}{C_s}$ small relative to unity, the usual case, the frequency change $\Delta F$ is inversely proportional to the square of the value of the capacitance $C$, this relationship holds true for a given compensating capacitance $\Delta C$ at any temperature. Therefore, in the conventional case where a variable capacitor is used and both $C_E$ and $C_B$ are larger, the frequency change $\Delta F$ is inversely proportional to the square of the value of the variable capacitance. When a given variable trimmer frequency range DF (which is equal to the difference between the highest frequency $F_1$ and the lowest frequency $F_2$ by which the crystal frequency is tunable by the variable trimmer capacitance) is required with a corresponding load capacitance change $DC_s$ (which is equal to the difference between the load capacitance $C_{s_1}$ at the high frequency $F_1$ and the load capacitance $C_{s_2}$ at the low frequency $F_2$), the ratio of the frequency compensation at the extremes of the crystal frequency controlled by the variable capacitance is given approximately by:

$$\frac{\Delta F_1}{\Delta F_2} = 1 + \left(\frac{2DC_s}{C_o + C_{s_1}}\right) \qquad (3)$$

where $DC_s = C_{s_2} - C_{s_1} = \frac{2DF}{10^6}$ $C_{s_1}$ = load capacitance corresponding to high frequency ($F_1$)

$C_{s_2}$ = load capacitance corresponding to low frequency ($F_2$).

With a typical crystal having the values $C_o = 6\ pf.$, $C_{s_1} = 24\ pf.$, $C_1 = 0.03\ pf.$ and trimmer frequency range $DF = 70$ p.p.m., the compensation capacitance change will be 28 percent giving a variation of ±14 percent within the trimmer frequency range *DF*.

Figure 2:
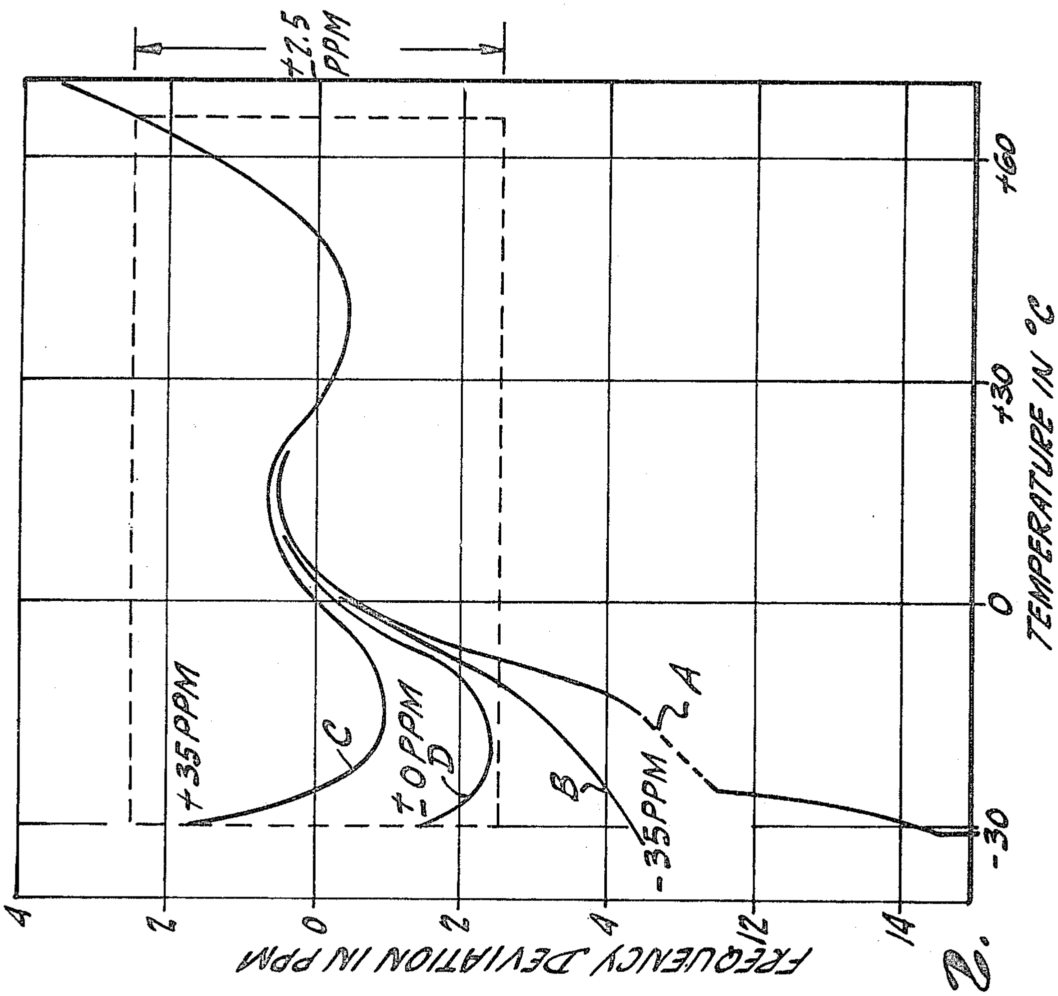
FIG. 2 is a series of curves useful in describing the operation of the embodiment shown in FIG. 1.

The meaning of this variation may be clearer if one considers a given compensation $\Delta C$ of 14 p.p.m. required at a particular temperature of interest. After an extended period of time, adjustment of oscillator frequency by a trimmer capacitor may be required due generally to crystal aging. When such trimmer capacitor adjustment is made, the compensation $\Delta C$ could itself change by as much as ±2.0 p.p.m. which would add to the overall frequency tolerance. FIG. 2 shows the variation in compensation in the commonly used and above mentioned variable trimmer capacitor. Curve A shows the change in frequency per change in temperature without using a compensation network 9. Curves B, C and D show the change in frequency per change in temperature for the low-, high- and middle trimmer frequencies to which the crystal is tunable by the capacitor respectively using compensation network 9. It is clear that with an overall frequency tolerance of ±2.5 p.p.m. required, for example, as shown in dotted lines, the oscillator frequency at the low-trimming range B will for the example given be outside and below the tolerance limit.

In accordance with the applicant's present invention the effect of the degree of compensation changing whenever a correction of the crystal frequency is required is reduced by coupling the compensating capacitance effectively in parallel with a fixed capacitor 27 and coupling the compensating capacitance effectively in series with the trimming capacitor 26. As shown in the circuit of FIG. 1, the trimmer capacitor C described above is divided into two series components. Capacitor 26 ($C_t$) is variable and used for frequency trimming. Capacitor 27 ($C_2$) is used for compensation and is fixed such that $\frac{1}{C} = \frac{1}{C_t} + \frac{1}{C_2}$.

The frequency compensating network 9 ($\Delta C_2$) is placed in parallel with fixed capacitor 27 ($C_2$) rather than in parallel with the total variable capacitance $C$. By differentiating equation (1) with respect to $C_2$, the compensating frequency change $\Delta F$ is given by:

$$\Delta F = \frac{-C_1 \Delta C_2 10^6}{2C_2^2\left(1+\frac{C_o}{C_s}\right)^2} \text{ in ppm} \qquad (4)$$

Since $\frac{C_o}{C_s}$ is small relative to unity, the frequency change is inversely proportional to the square of the fixed capacitance 27 ($C_2$) and therefore will remain substantially constant within the trimming capacitor range *DF*. The amount of variation will depend only on the particular value of $\frac{C_o}{C_s}$ relative to unity. If $\Delta F_1$ and $\Delta F_2$ are the frequency changes at the extremes of the crystal frequency controlled by the capacitance 26 in series with fixed capacitor 27, the ratio in this case is given approximately by:

$$\frac{\Delta F_1}{\Delta F_2} = \left(1 + \frac{2DC_s}{C_o + C_{s_1}}\right)\left(\frac{1}{1+\frac{2DC_s}{C_{s_1}}}\right) \qquad (5)$$

where $DC_s$ is $= \left(\frac{2DF}{10^6}\right)\left(\frac{(C_o + C_{s_1})^2}{C_1}\right)$ With the same typical crystal described above and the same trimmer frequency range $DF = 70$ p.p.m. required as in the previous case, the compensation variation or change within the trimming frequency range *DF* will now be only ±2.5 percent and therefore the compensation change after the frequency is altered would be very small and the overall frequency tolerance would be maintained.

Figure 3:
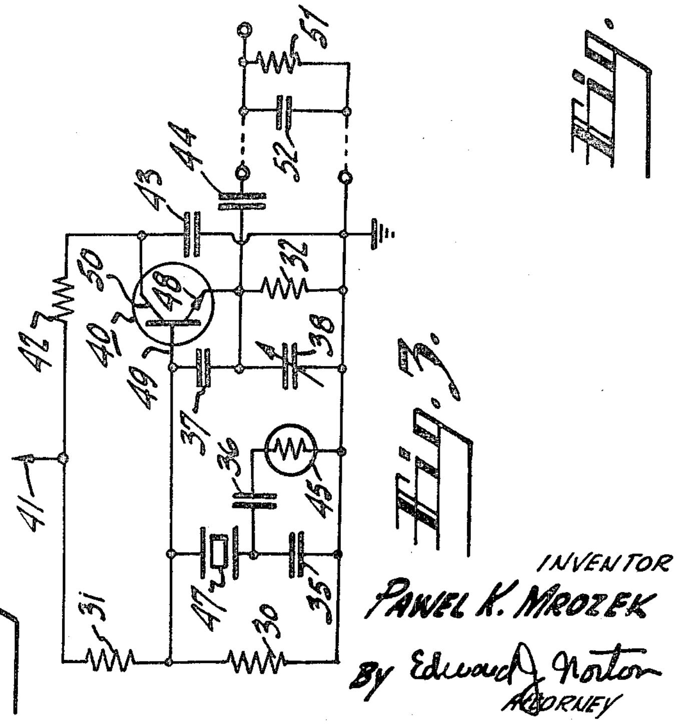
FIG. 3 is a circuit diagram of a temperature compensated oscillator according to a second embodiment of the applicant's invention.

In accordance with another embodiment of the applicant's present invention, the effects of the degree of compensation changing whenever a correction of the crystal frequency is required is further reduced by making use of both the capacitive and resistive changes of a thermistor-capacitive network, or equivalent circuit, where the compensation process includes capacitance change and resistance change expressed as a function of temperature. In the case of thermistor-capacitance compensation the two functions are mutually dependent but it is possible to arrive at a circuit wherein the variables can be independently controlled. FIG. 3 shows such a circuit which is a modification of the circuit shown in FIG. 1. A transistor 40 is shown illustratively as an NPN transistor and biased by a stabilized voltage applied at terminal 41. The positive terminal of a unidirectional potential source (not shown) is connected to terminal 41 with its return terminal to ground or other reference potential. Resistors 30, 31 and 32 provide the conventional transistor bias but since resistor 32 in this circuit also provides a load in parallel with the variable capacitor 38, it is part of the compensation and the values are carefully selected. Capacitors 35, 36, 37 and 38 make up the crystal load capacitance. A resistor 42 and an RF bypass capacitor 43 are connected in series between the positive terminal 41 and ground with the junction of capacitor 43 and resistor 42 coupled to collector 50. Capacitor 44 is an output coupling capacitor. The frequency determining circuit comprises crystal 47 in series with fixed capacitor 35 and includes capacitor 37 and variable capacitor 38. Capacitors 37 and 38 control the amount of feedback to sustain oscillations. Capacitor 38 is made variable and is used for frequency trimming. Capacitor 35 ($C_f$) is a fixed capacitor across which a temperature sensitive network comprising capacitor 36 ($\Delta C_f$) and thermistor resistance ($R_t$) 45 is connected. The solution of the voltage equivalent circuit gives the approximate frequency of oscillation as presented in the above equation (1).

$$\frac{\Delta f}{f_o}=\left(\frac{C_1\cdot 10^6}{2(C_o+C_s)}\right)\left(1+\frac{C_sR_s}{C_ER_E}+\frac{C_sR_s}{C_BR_B}\right) \qquad (1)$$

where $C_s$ is given by $\frac{1}{C_s}=\frac{1}{C_E}+\frac{1}{C}+\frac{1}{C_B}$ $C$ = capacitor 35 ($C_f$) + capacitor 36 ($\Delta C_f$) at reference temperature where thermistor resistance 45 ($R_t$) is small, $\Delta R_s$= small resistance in series with capacitor 36 and is added to the total resistance $R_s$.

Assuming $C_BR_B$ can be made much larger than $C_ER_E$, the expression can be rewritten as:

$$\frac{\Delta f}{\Delta f_o}=\frac{C\cdot 10^6}{2(C_o+C_s)}+\frac{C_1\cdot 10^6}{2\left(1+\frac{C_o}{C_s}\right)}\cdot\frac{R_s}{C_ER_E} \qquad (6)$$

Examination of the Equation (6) above indicates that the frequency of oscillation is made up of two parts, one dependent on $C_s$ and independent of $R_s$ and the other dependent on $R_s$ and almost independent of $C_s$, since $\frac{C_o}{C_s}$ is small compared to unity.

As the temperature changes from the reference temperature (where the thermistor 45 ($R_t$) resistance is small and total capacitance $C$ is equal to the sum of capacitors 35 ($C_f$) and 36 ($\Delta C_f$) to a lower temperature, the thermistor resistance 45 ($R_t$) increases and total capacitance $C$ is reduced by corresponding compensating capacitance change $\Delta C$. At the same time the coupled resistance $\Delta R_s$ (due to thermistor ($R_t$) 45) increases from a negligible value so that the frequency change is also brought about by it; the magnitude of change is controlled by $\frac{1}{C_ER_E}$.

The effect of the frequency change due to capacitance change $\Delta F$ ($C_s$) and the frequency change due to resistance change $\Delta F$ ($R_s$) are used to achieve compensation independent of the trimmer frequency capacitor 38. From Equation (6)

$$\text{frequency due to } C_s=F(C_s)=\frac{C_1\cdot 10^6}{2C\left(1+\frac{C_o}{C_s}\right)} \qquad (7)$$

and the frequency due to $R_s$ is $F(R_s)$ $$=\left(\frac{C_1\cdot 10^6}{2\left(1+\frac{C_o}{C_s}\right)}\right)\left(\frac{R_s}{C_ER_E}\right) \qquad (8)$$

Since these two frequency components are mutually independent as far as $C_s$ and $R_s$ are concerned, the total frequency change of $C_s$ and $R_s$ change can be obtained by differentiating $F(C_s)$ with respect to $C_s$ and $F(R_s)$ with respect to $R_s$ yielding: Frequency change due to small $$\Delta C_s=\Delta F(C_s)=\frac{-C_1\cdot 10^6\Delta C_s}{2C_s^2\left(1+\frac{C_o}{C_s}\right)^2} \qquad (9)$$

Since compensation is applied in parallel with fixed capacitor 35 ($C_f$) frequency change due to small compensating capacitance change $$\Delta C_f=\Delta F(c)=\frac{-C_1\cdot 10^6\Delta C}{2C_f^2\left(1+\frac{C_o}{C_s}\right)^2} \qquad (10)$$

Frequency change due to small $$\Delta R_s=\Delta F(R_s)=\frac{C_1\Delta R_s\cdot 10^6}{2\left(1+\frac{C_o}{C_s}\right)C_ER_E} \qquad (11)$$

Now, compensating capacitance change $\Delta C$ is negative (less capacitance), when $\Delta R_s$ is positive (more resistance). Thus, when the temperature changes from the reference temperature to a lower temperature, both changes are positive, and therefore, the total frequency change is:

$$\Delta F=\Delta F(C_f)+\Delta F(R_s)=\frac{C_1\Delta C\cdot 10^6}{2C_f^2\left(1+\frac{C_o}{C_s}\right)^2}+\frac{C_1}{2\left(1+\frac{C_o}{C_s}\right)}\cdot\frac{\Delta R_s\cdot 10^6}{C_ER_E} \qquad (12)$$

The following conditions can be observed from Equation 12 in considering the extremes of the crystal frequency controlled by the variable capacitor 38 (1) at high-trimming frequency, both $C_E$ and $C_s$ are small; so that the first term of the Equation (12) is small and the second term of the equation is large. (2) at low-trimming frequency, both $C_E$ and $C_s$ are large; so that the first term of the Equation (12) is large and the second term is small. Therefore, within a given variable trimmer capacitance range $DF$, the change in amount of frequency compensation due to the capacitive effect is counteracted by the opposite change in compensation due to resistive effect.

In the embodiment shown in FIG. 3 conditions for perfect cancellation of these two changes can be obtained by differentiating Equation (12) with respect to $C_E$ and equating to zero, which yields:

$$R_E=\frac{\Delta R_s}{2}\cdot\frac{C_f}{\Delta C}\cdot\frac{C}{C_o}\left(1+\frac{2C_o}{C}+\frac{C_o}{C_E}\right) \qquad (13)$$

Thus, the required resistance 32 ($R_E$) is given in terms of $\Delta R_s$, $\Delta C$, $C_f$, $C_E$ and the crystal parameter. Since $\frac{C_o}{C_E}$ is very small compared to unity, resistance 32 ($R_E$) is practically independent of $C_E$; therefore, an almost perfect stability of compensation is achieved within the trimmer capacitor range.

In practice, the resistance change $\Delta R_s$ of a simple thermistor-capacitor compensating network is dependent on the compensation capacitance change $\Delta C$. Thus, when an exact change in frequency $\Delta F$ is required according to design requirements, Equation 13 may be inconvenient to use. However, the resistive component of the compensation $\Delta F(R_s)$ will be usually small compared to $\Delta F(C_s)$; consequently, an approximate $\Delta F$ given by Equation (1) can be first used to calculate the thermistor-capacitor network in terms of capacitance change ($\Delta C$) alone. The correct amount of AC resistive loading (resistance $R_E$) in parallel with variable capacitor 38 can then be selected to obtain the best results. The resistance 32 ($R_E$) in FIG. 3 serves the dual function of conventional DC bias and sets the AC resistance to the correct value to provide the correct amount of resistive loading in parallel with the variable capacitor 38.

An example of component values for the oscillator circuit shown in FIG. 3 wherein compensation is provided by making use of both the capacitive and resistive changes of the thermistor-capacitor network is listed below. The circuit shown in FIG. 3 includes a capacitor 52 and resistor 51 which provides the load termination.

Crystal 47

| | |
|---|---|
| Frequency | 8.5 MHZ |
| Load Capacitance ($C_s$) | 25 pf. |
| Motional Capacitance ($C_1$) | 0.03 pf. |
| Shunt Capacitance ($C_0$) | 6.0 pf. |

Thermistor 45 RL1B1

| | |
|---|---|
| Resistance at 37° C. | 43.6 ohms |
| Resistance at −30° | 780 ohms |
| Capacitor 35 | 43 pf. |
| Capacitor 36 | 16 pf. |
| Capacitor 37 | 820 pf. |
| Capacitor 38 | (variable) 5–20 pf. |
| Capacitor 43 | 05 μf. |
| Capacitor 52 | 33 pf. |
| Resistor 30, 31 | 22 kΩohms |
| Resistor 32 | 4.3 kΩ |
| Resistor 42 | 220 ohms |
| Resistor 51 | 50kΩ |
| Direct voltage power supply 41 | +10 volts |
| Transistor | RCA 40242 |

Effective trimmer range including the load termination (33 *pf.*) and the collector-to-emitter output capacitance of transistor 40 (2 pf.) is equal to 40 pf.–60 pf.

What is claimed is:

1. A temperature compensated crystal oscillator comprising:

a semiconductor device having an input electrode, an output electrode and common electrode, connection means for applying energizing potentials between said electrodes, a frequency controlling resonant circuit including a crystal connected in series with a series combination of a variable capacitor and a first fixed capacitor coupled between said input and said output electrode, regenerative feedback means comprising a pair of series connected fixed capacitors connected in shunt to said resonant circuit, a connection from the junction point of said series connected fixed capacitors to said common electrode to provide oscillations, said crystal being frequency sensitive to changes in the crystal load capacitance, to changes in temperature and to long term crystal aging, a network comprising a temperature variable resistance in series with a capacitance responsive to said temperature changes at a given selected frequency and connected in said oscillator provide a given degree of crystal load capacitance change over a given frequency range so as to keep said selected frequency within a given frequency tolerance for frequency shifts due to said temperature changes, said variable capacitor functioning to correct the crystal frequency drifts due to long term crystal aging and which when varied changes said degree of crystal load capacitance by said network so that said selected frequency is outside said given frequency tolerance, said network being connected across only said first fixed capacitor thereby reducing said changes brought about by the setting of said variable capacitor in the degree of load capacitance change by said network to thereby maintain said given frequency tolerance.

2. The combination as claimed in claim 1 wherein the values of said pair of series connected fixed capacitors in shunt with said resonant circuit are relatively large compared to said series combination of said variable and said first fixed capacitors making the oscillator frequency primarily dependent on the crystal in series with said series combination of said first fixed and said variable capacitor.

* * * * *

UNITED STATES PATENT OFFICE
CERTIFICATE OF CORRECTION

Patent No. 3,641,461 Dated February 8, 1972

Inventor(s) Pawel K. Mrozek

It is certified that error appears in the above-identified patent and that said Letters Patent are hereby corrected as shown below:

Data-Cover Sheet, Item [63], under "Related U.S. Application Data" correct "Continuation-in-Part" to read --Continuation--.

Column 1, line 24, correct "$(C_5)$" to read --$(C_s)$--.

Column 3, line 30, correct "larger" to read --large--.

Column 6, line 5, correct "$\frac{-C_1 . 10^6 \Delta C}{2C^2{}_f \left(1+\frac{C_0}{C_s}\right)^2}$" to read -- $\frac{-C_1 . 10^6 \Delta C_f}{2C_f^2 \left(1+\frac{C_0}{C_s}\right)^2}$ --.

Signed and sealed this 22nd day of August 1972.

(SEAL)
Attest:

EDWARD M.FLETCHER,JR.
Attesting Officer

ROBERT GOTTSCHALK
Commissioner of Patents

USCOMM-DC 60376-P69
U.S. GOVERNMENT PRINTING OFFICE : 1969 O—366-334.